(12) United States Patent
Mizusawa

(10) Patent No.: US 8,742,651 B2
(45) Date of Patent: Jun. 3, 2014

(54) PIEZOELECTRIC VIBRATING PIECES AND PIEZOELECTRIC DEVICES COMPRISING SAME, AND METHODS FOR MANUFACTURING SAME

(75) Inventor: Shuichi Mizusawa, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 105 days.

(21) Appl. No.: 13/454,645

(22) Filed: Apr. 24, 2012

(65) Prior Publication Data

US 2012/0280598 A1    Nov. 8, 2012

(30) Foreign Application Priority Data

May 6, 2011 (JP) ................................. 2011-103366

(51) Int. Cl.
*H01L 41/053* (2006.01)
*H01L 41/047* (2006.01)

(52) U.S. Cl.
USPC ........... 310/366; 310/364; 310/348; 310/365; 310/363

(58) Field of Classification Search
USPC ......... 310/363–367, 348, 344, 320–321, 311, 310/340
IPC ............................................ H01L 41/047, 41/53
See application file for complete search history.

(56) References Cited

U.S. PATENT DOCUMENTS

| | | | | |
|---|---|---|---|---|
| 7,732,995 | B2* | 6/2010 | Tsuchido et al. | 310/348 |
| 7,745,979 | B2* | 6/2010 | Tsuchido | 310/365 |
| 7,948,156 | B2* | 5/2011 | Satoh et al. | 310/364 |

FOREIGN PATENT DOCUMENTS

JP    2002-299982    10/2002

* cited by examiner

*Primary Examiner* — Thomas Dougherty
*Assistant Examiner* — Karen B Addison
(74) *Attorney, Agent, or Firm* — Klarquist Sparkman, LLP

(57) ABSTRACT

Exemplary piezoelectric vibrating pieces have an excitation electrode and an extraction electrode having uniform thickness in the vibrating region to prevent unnecessary vibrations and degradation of vibration characteristics. An exemplary piezoelectric vibrating piece includes a vibrating portion having an excitation electrode of a first thickness ($d_1$), an outer frame surrounding the vibrating portion with a gap therebetween, a joining portion connecting the vibrating portion and the outer frame, and an extraction electrode connected to the excitation electrode and extending on the vibrating portion, joining portion, and outer frame. The extraction electrode has the first thickness $d_1$ throughout the vibrating portion and a second thickness ($d_2 > d_1$) on the outer frame.

14 Claims, 11 Drawing Sheets

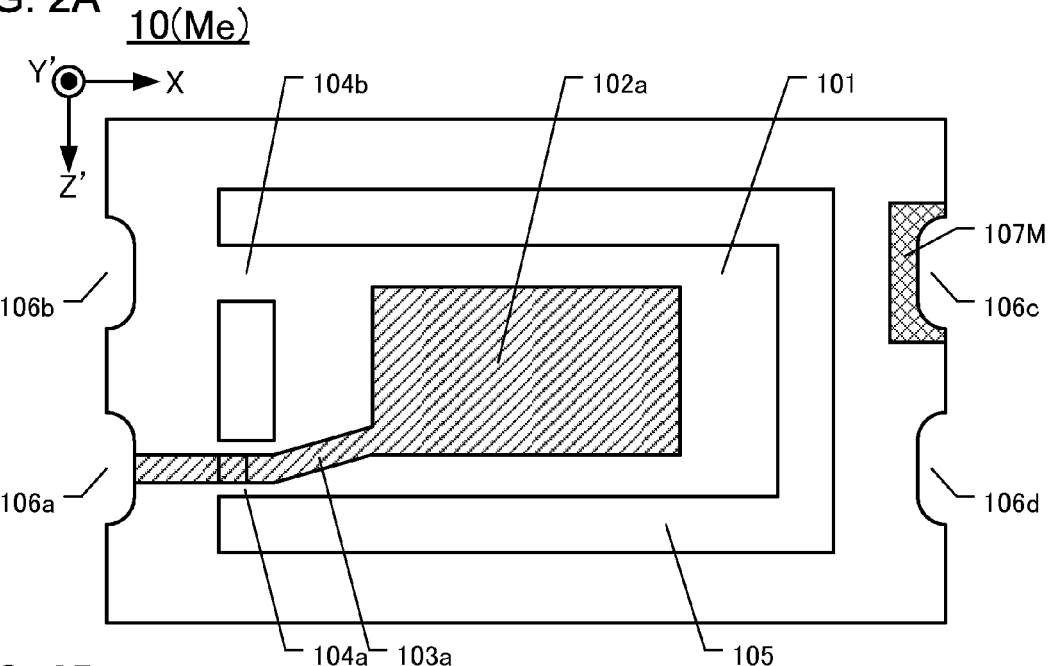
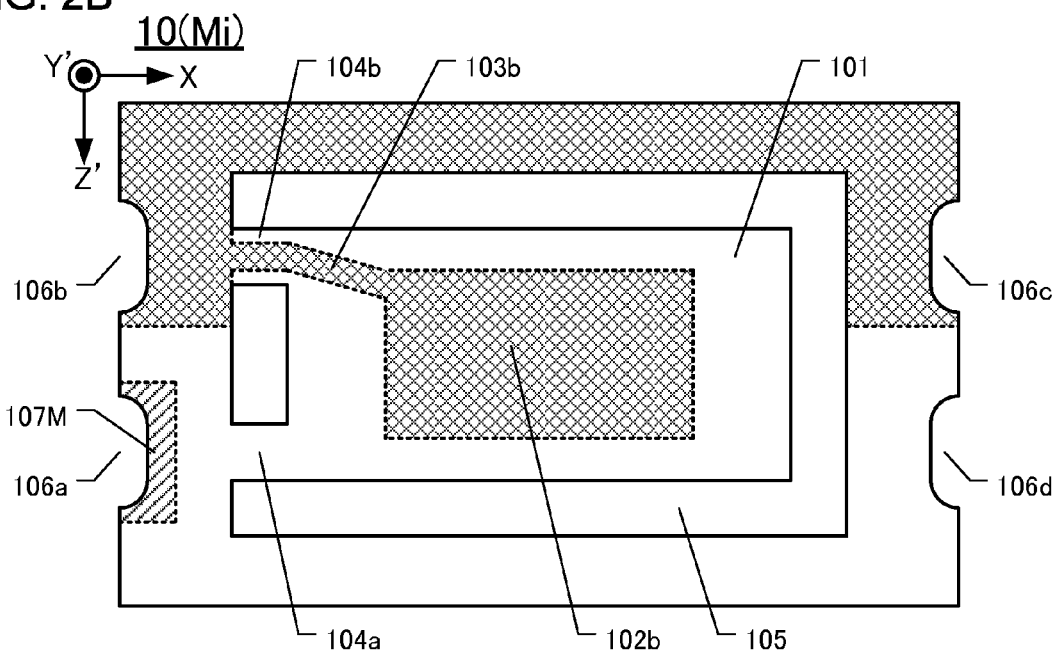
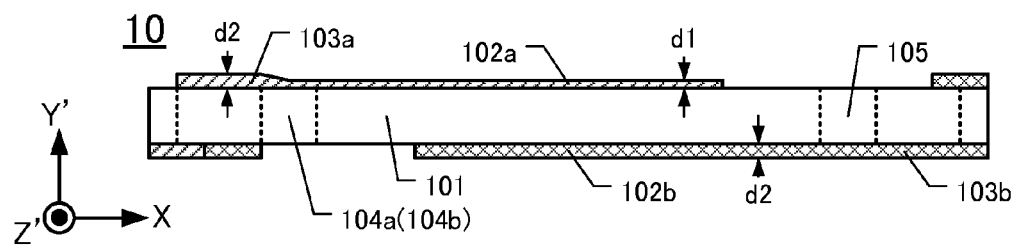

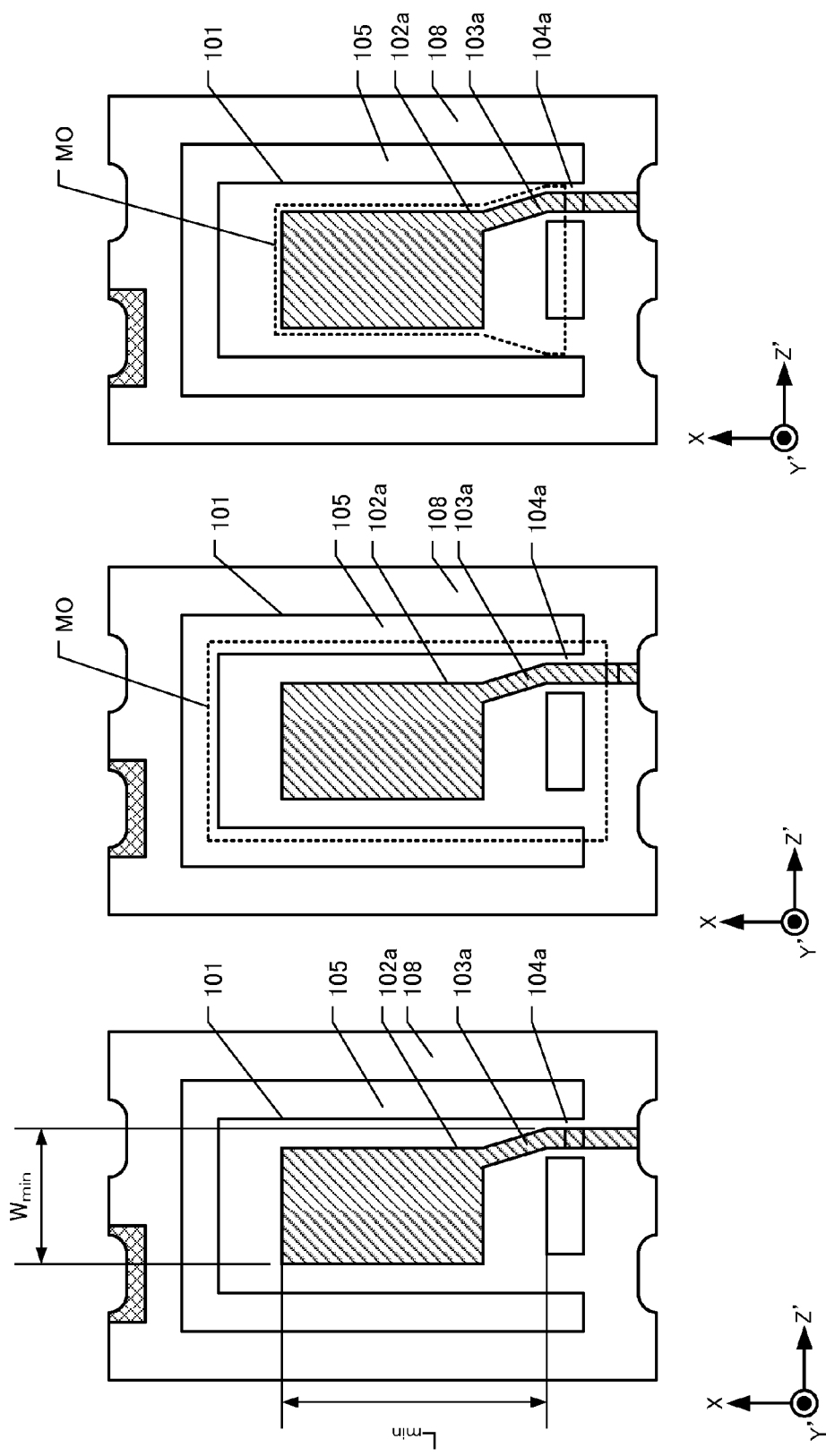

PIEZOELECTRIC VIBRATING PIECES AND PIEZOELECTRIC DEVICES COMPRISING SAME, AND METHODS FOR MANUFACTURING SAME

CROSS-REFERENCE TO RELATED APPLICATION

This application claims priority to and the benefit of Japan Patent Application No. 2011-103366, filed on May 6, 2011, in the Japan Patent Office, the disclosure of which is incorporated herein by reference in its entirety.

FIELD

The present invention relates to, inter alia, piezoelectric vibrating pieces and piezoelectric devices comprising same. The present invention also relates to methods for manufacturing such devices.

DESCRIPTION OF THE RELATED ART

Conventionally, the vibration frequency of a piezoelectric vibrating piece (PVP) is adjusted by mounting the piezoelectric vibrating piece in a ceramic package and "thinning" (reducing the thickness of) the excitation electrodes of the PVP. If thinning is performed using a mask having an opening having the same dimensions as the excitation electrode, after thinning the thickness of the excitation electrode around its periphery is greater than in other regions of the excitation electrode, which forms a peripheral "step" on the surface of the excitation electrode. The presence of a step creates unnecessary vibrations and degrades the quality of the desired vibration produced by the PVP.

Japan Unexamined Patent Application No. 2002-299982 discusses a PVP of which a first excitation electrode is thinned while a second excitation electrode is not thinned. The first excitation electrode (destined for thinning) is larger in area than the second excitation electrode. The area of the first excitation electrode destined for thinning is defined by a mask having an opening that is larger than the area of the second excitation electrode but smaller than the area of the first excitation electrode. The aim is to produce PVPs in which the thickness of the excitation electrode (including the thinned region) is uniform. However, since the mask in JP '982 has an opening that is smaller than the first excitation electrode, a step tends to form on the corresponding extraction electrode extending from the first excitation electrode. The steps create boundaries, in the extraction electrode, that produce unnecessary vibrations and degrade vibration characteristics.

In view of the above, an object of the present invention is to provide PVPs in which excitation electrodes and extraction electrodes, situated in a vibrating region of the PVP, have uniform thickness. Uniformity of thickness prevents extraneous vibrations and degradations of vibration quality.

SUMMARY

A first aspect of the invention pertains to piezoelectric vibrating pieces. An embodiment of a piezoelectric vibrating piece comprises a vibrating portion, an outer frame, a joining portion, and an extraction electrode. The vibrating portion has a center region including an excitation electrode, wherein the excitation electrode is no thicker than a first thickness. The outer frame surrounds the vibrating portion, with a gap between the vibrating portion and the outer frame. The joining portion extends across the gap and couples the vibrating portion to the outer frame. The extraction electrode is electrically connected to the excitation electrode and extends from the vibrating portion, across the joining portion, to the outer frame. The extraction electrode has the first thickness on the vibrating portion and a second thickness on at least part of the joining portion or on at least part of the outer frame. The second thickness is greater than the first thickness.

In many embodiments the extraction electrode on the joining portion includes at least a portion thereof having the first thickness. For example, a first excitation electrode having the first thickness can be situated on a first main surface of the vibrating portion. A second excitation electrode having the second thickness can be situated on a second main surface, opposite the first main surface, of the vibrating portion. The second excitation electrode can be coextensive with the first excitation electrode.

The piezoelectric vibrating piece of the various embodiments can be configured as a mesa-type, a piano-mesa type, an inverted-mesa-type, or inverted-piano-mesa type, for example.

A second aspect is directed to piezoelectric devices that comprise a piezoelectric vibrating piece as summarized above sandwiched between a first plate bonded to a first main surface of the outer frame and a second plate bonded to a second main surface of the outer frame.

Yet another aspect is directed to methods for manufacturing a piezoelectric device. In an exemplary embodiment of such a method, an array of multiple piezoelectric vibrating pieces is formed on a piezoelectric wafer. Each piezoelectric vibrating piece comprises a respective vibrating portion, a respective outer frame surrounding the vibrating portion with a respective gap between the vibration portion and the outer frame, and at least one respective joining portion extending across the gap and coupling the vibrating portion to the outer frame. Each vibrating portion includes a first main surface and a center region of the first main surface. An excitation electrode is formed on at least one piezoelectric vibrating piece on the wafer. The excitation electrode is formed in the center region of the first main surface of the vibrating portion, and has a designated first thickness. In the at least one piezoelectric vibrating piece, an extraction electrode is formed that is connected to the excitation electrode and that extends on the vibrating portion, the joining portion, and the outer frame. A measurement is obtained of the vibration frequency of the at least one piezoelectric vibrating piece. Based on the measurement, the vibration frequency is adjusted by reducing the thickness of the excitation electrode (and of any portion of the extraction electrode located on the vibrating portion) to a second thickness that is less than the first thickness.

In various embodiments the step of adjusting the vibration frequency further comprises reducing the thickness, of at least a portion of the extraction electrode on the joining portion, to the second thickness. Thickness reduction desirably is performed by applying a stream of ions through a mask onto the excitation electrode and respective regions of the extraction electrode to ion-mill the excitation electrode and respective regions of the extraction electrode. In this technique the mask includes an opening through which the ion stream passes. The opening desirably extends onto the joining portion.

In many embodiments the excitation electrode and extraction electrode at the first thickness (before ion milling) produce a vibration of the vibrating portion that is lower in frequency than a predetermined desired vibration frequency produced by the vibrating portion after ion milling.

Providing the excitation electrode and extraction electrode on the vibrating region at uniform thickness prevents unnecessary vibrations and degradations of vibration characteristics.

BRIEF DESCRIPTION OF THE DRAWINGS

FIG. 2A is a plan view of a first embodiment of a quartz-crystal vibrating piece, as viewed from above the +Y'-surface thereof, as used in the first embodiment of a quartz-crystal vibrating device.

FIG. 2B is a plan view of the quartz-crystal vibrating piece of FIG. 2A, but drawn as if it were transparent, as viewed from above the +Y'-surface thereof.

FIG. 2C is an elevational section of the first embodiment of a quartz-crystal vibrating piece, as viewed toward the +Z'-side thereof.

FIG. 11A is a plan view of the profile of a first exemplary opening in a mask.

FIG. 11B is a plan view of the profile of a second exemplary opening in a mask.

FIG. 11C is a plan view of the profile of a third exemplary opening in a mask.

DETAILED DESCRIPTION

In the following embodiments, an AT-cut quartz-crystal vibrating piece is described as an exemplary piezoelectric vibrating piece. An AT-cut quartz-crystal material has a principal surface (in the YZ plane) that is tilted by 35° 15' about the Y-axis of a crystal-coordinate system (XYZ) in the direction of the Y-axis from the Z-axis around the X-axis. In the following description, new axes that are tilted with respect to the axial directions of the AT-cut quartz-crystal vibrating piece are denoted as the Y'-axis and Z'-axis, respectively. Therefore, in the quartz-crystal vibrating device, the longitudinal direction of the piezoelectric device is the X-axis direction, the height direction is the Y'-axis direction, and the direction perpendicular to the X-axis and Y'-axis directions is the Z'-axis direction.

Representative Embodiment of a Quartz-crystal Vibrating Device

Figure 1:
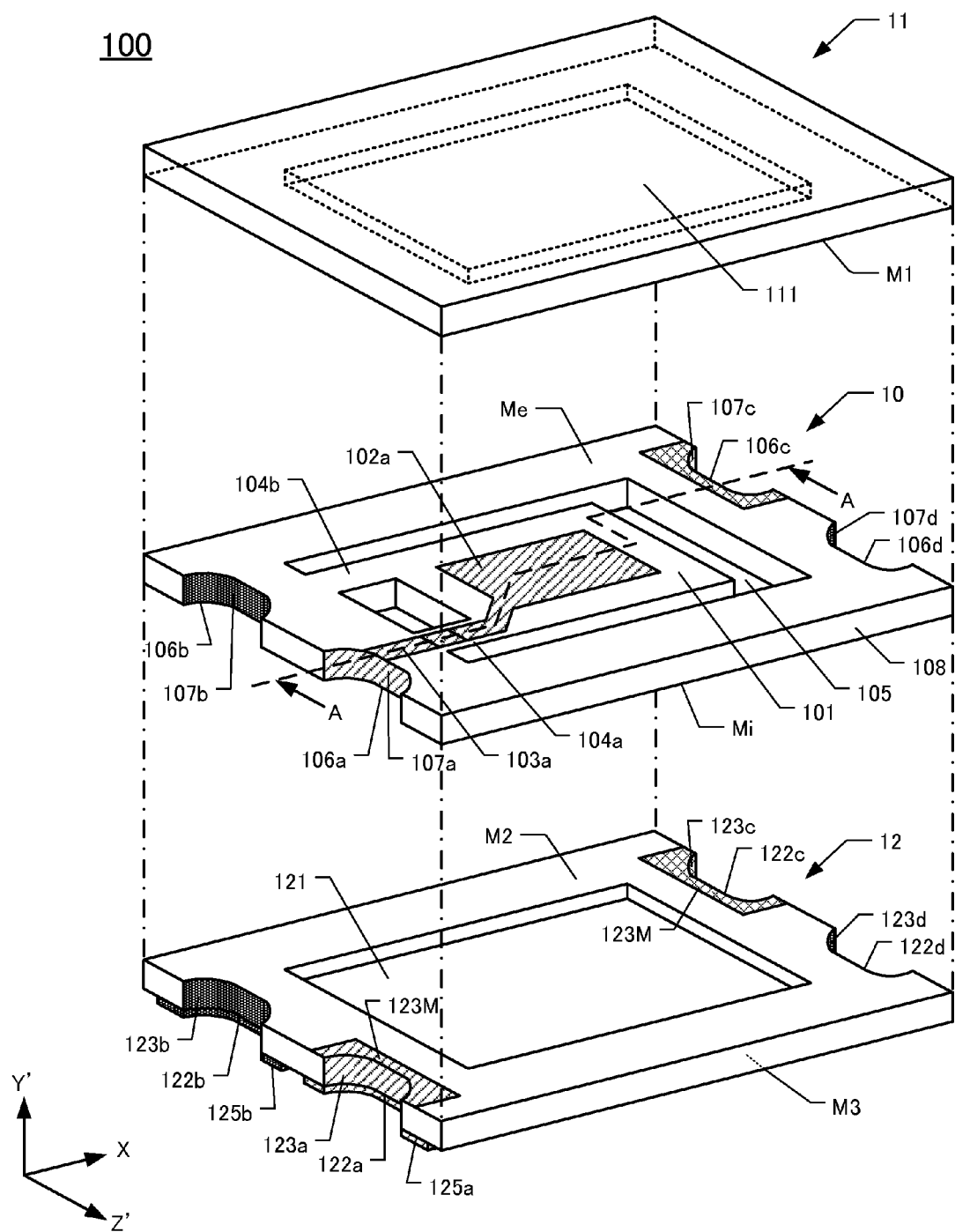
FIG. 1 is an exploded perspective view of a first embodiment of a quartz-crystal vibrating device.

FIG. 1 is an exploded perspective view of a representative embodiment of a quartz-crystal vibrating device 100. In FIG. 1, low-melting-point (LMP) glass LG is used as a sealing material. The LMP glass is depicted as if it were transparent. The quartz-crystal vibrating device 100 comprises a package lid 11 defining a lid recess 111, a package base 12 defining a base recess 121, and a rectangular quartz-crystal vibrating piece 10 sandwiched between the package lid 11 and package base 12.

An exemplary embodiment of a quartz-crystal vibrating piece 10 as used in the device of FIG. 1 is shown not only in FIG. 1 but also in FIGS. 2A-2C. FIG. 2A is a plan view of the quartz-crystal vibrating piece 10, as viewed from above the +Y'-surface thereof. FIG. 2B is a plan view of the quartz-crystal vibrating piece 10 of FIG. 2A, but drawn as if it were transparent, as viewed from above the +Y'-surface thereof. FIG. 2C is an elevational section of the quartz-crystal vibrating piece 10, as viewed toward the +Z'-side thereof.

The quartz-crystal vibrating piece 10 comprises a rectangular vibrating portion 101 surrounded by an outer frame 108. Extending in the −X-axis direction from the vibrating portion 101 to the outer frame 108 are joining portions 104a, 104b. The joining portions 104a, 104b are connected to the outer frame 108, which leaves a through-slot 105 between the vibrating portion 101 and the outer frame 108. The through-slot extends depthwise completely through the quartz-crystal vibrating piece 10, nearly surrounding the vibrating piece. Rounded, rectangular castellations 106a-106d are situated on respective +X- and −X-edges of the quartz-crystal vibrating piece 10. The castellations extend width-wise in the respective X-axis directions and lengthwise in the Z'-axis directions (see FIGS. 6 and 7). Two castellations are defined on each X-edge. Specifically, a pair of castellations 106a, 106b is defined on the −X-edge, and a pair of castellations 106c, 106d is defined on the +X-edge. Each castellation 106a-106d includes a respective edge-surface electrode 107a-107d.

In FIG. 2A a first rectangular excitation electrode 102a is situated in the center of the first main surface Me of the vibrating portion 101. A respective extraction electrode 103a extends from the excitation electrode 102a over the nearby edge of the vibrating portion 101, over the respective joining portion 104a onto the outer frame 108, to the edge-surface electrode 107a on the −X-edge of the quartz-crystal vibrating piece 10. The edge-surface electrode 107a desirably extends from the first surface Me to the second surface Mi of the quartz-crystal vibrating piece 10. The edge-surface electrode 107a also forms a respective connecting pad 107M (see FIG. 2B).

In FIG. 2B a second rectangular excitation electrode 102b is situated in the center of the second surface Mi of the vibrating portion 101. A respective extraction electrode 103b extends from the excitation electrode 102b and extends over the nearby edge of the vibrating portion, over the respective joining portion 104b onto the outer frame 108, and to the edge-surface electrode 107c on the +X-edge of the quartz-crystal vibrating piece 10. The edge-surface electrode 107c desirably extends from the first surface Me to the second surface Mi of the quartz-crystal vibrating piece 10. The edge-surface electrode 107b also fauns a respective connecting pad 107M (see FIG. 2A).

Each excitation electrode 102a, 102b and extraction electrode 103a, 103b desirably comprises a foundation layer of chromium (Cr) with an overlying layer of gold.

As shown in FIG. 2C, the excitation electrode 102a formed on the first surface Me has a first thickness $d_1$. Also having this thickness are the respective extraction electrode 103a on the respective joining portion 104a (apart that is closer to the vibrating portion 101). The other electrodes on the quartz-crystal vibrating piece 10 (such as the excitation electrode 102b and part of the extraction electrodes 103a, 103b) have a second thickness $d_2$.

The thickness of chromium in the foundation layers is similar in both thicknesses $d_1$ and $d_2$. However, the thickness of the overlying layer of gold may differ. A gold layer denoted as having thickness $d_1$ is thinner than the gold layer denoted as having thickness $d_2$. Thus, $d_1 < d_2$.

The quartz-crystal vibrating piece 10 can be mesa-type, piano-mesa type, inverted-mesa type, or inverted piano-mesa type, for example.

The extraction electrode 103a of this embodiment 10 increases in thickness from $d_1$ to $d_2$ in the joining portion 104a. The portion of the extraction electrode on the vibrating portion 101 can have thickness $d_1$, while other portions of the extraction electrode can have thickness $d_2$. Alternatively, the extraction electrode 103a can have thickness $d_1$ where it joins the edge of the vibrating portion 101 and over the entire joining portion 104a. The extraction electrode 103a has thickness $d_2$ on the outer frame 108. Further alternatively, the extraction electrode 103a can have thickness $d_1$ at the edge of the vibrating portion 101, over the entire joining portion 104a, and in a region of the outer frame 108 closest to the joining portion 104a. The extraction electrode 103a has thickness $d_2$ on all other regions of the outer frame 108 where the extraction electrode is present.

Figure 3A:
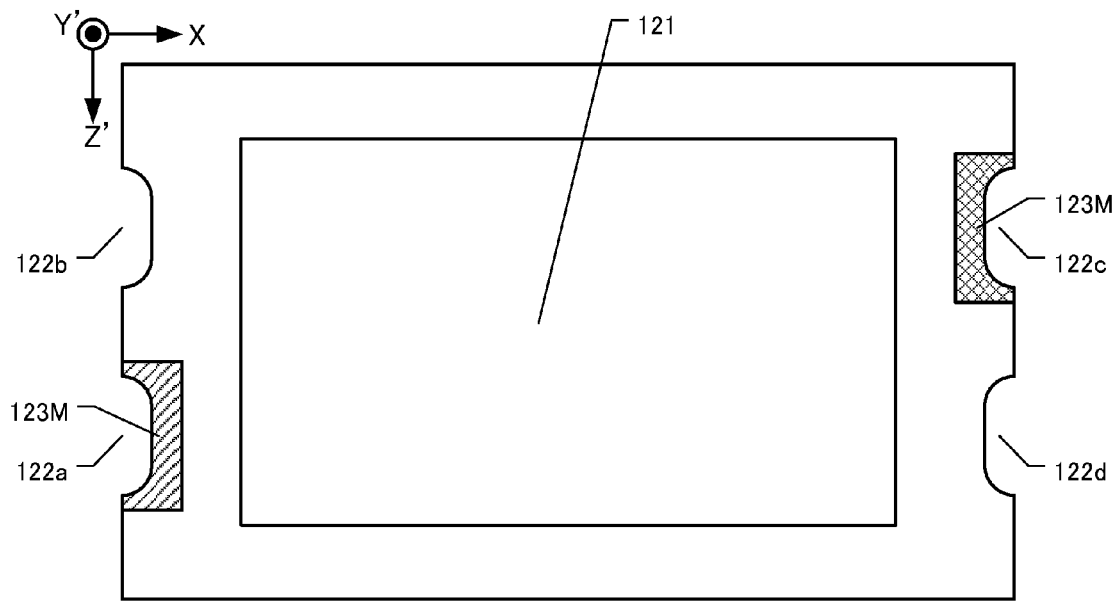
FIG. 3A is a plan view of the package base of the first embodiment of a quartz-crystal vibrating device, as viewed from above the +Y'-surface thereof.

The overall configuration of the package base 12 is described with reference to FIGS. 3A-3B. FIG. 3A is a plan view of the package base 12, as viewed from above the +Y'-surface, and FIG. 3B is a plan view of the package base 12 drawn as if it were transparent, as viewed from above the +Y'-surface.

The package base 12 desirably is fabricated from a sheet or the like of glass or piezoelectric material. The package base 12 comprises a second peripheral surface M2 on its first surface (+Y'-surface), which peripherally surrounds a base recess 121 (see also FIG. 1). Two base castellations 122a, 122b and 122c, 122d are formed on each X-edge surface of the package base 12. The base castellations 122a-122d are formed simultaneously during formation of the through-holes BH (see FIGS. 9 and 10). Specifically, the base castellations 122a, 122b are formed on the –X-edge, and the base castellations 122c, 122d are formed on the +X-edge of the package base 12. Each base castellation 122a-122d includes a respective edge-surface electrode 123a-123d (see FIG. 1). The edge-surface electrodes 123a, 123c are situated diagonally from each other and desirably extend over respective portions of the second peripheral surface M2 to form respective connecting pads 123M.

Figure 3B:
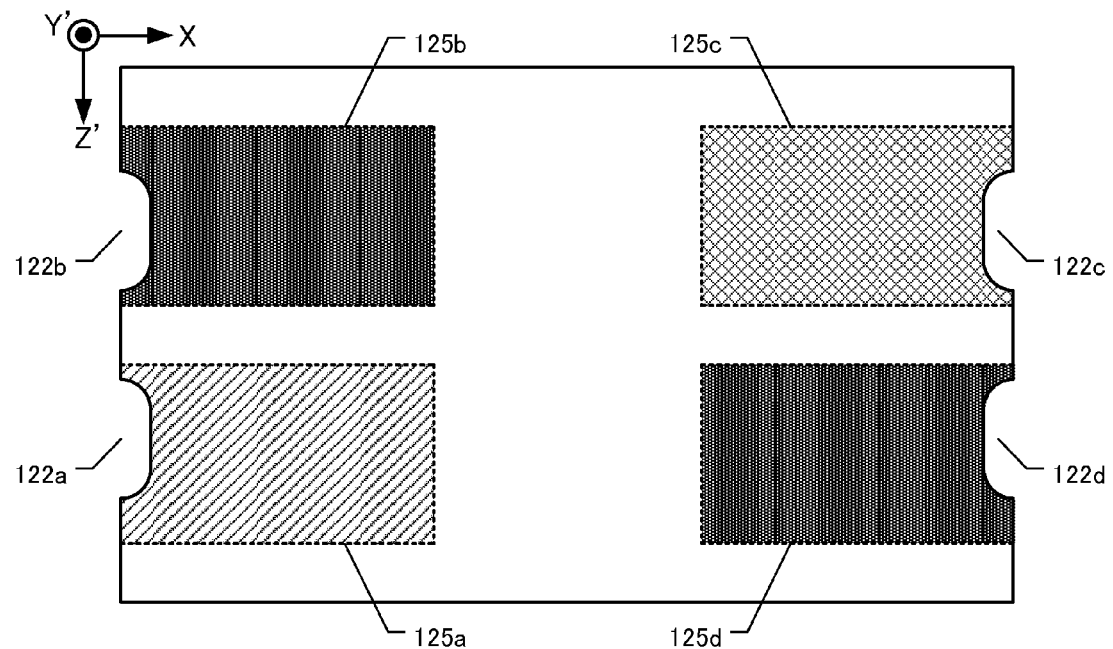
FIG. 3B is a plan view of the package base of FIG. 3A, but drawn as if it were transparent, as viewed from above the +Y'-surface thereof.

As shown in FIG. 3B, mounting terminals 125a-125d extend over respective portions of the outer surface M3 of the package base 12. The mounting terminals 125a-125d are electrically connected to respective connecting pads 122a-122d via respective edge-surface electrodes 123a-123d. A first pair of mounting terminals 125a, 12c, diagonally opposed on the package base 12, serves as external electrodes (hereinafter referred to as "external electrodes" 125a, 125c). Each external electrode 125a, 125c is connected to a respective voltage (not shown) for inducing production of vibration by the quartz-crystal vibrating piece 10. The other pair of mounting terminals 125b, 125d, also diagonally opposed on the package base 12, serves as grounding electrodes (hereinafter referred to as "grounding electrodes" 125b, 125d). The external voltage is not applied to the grounding electrodes 125b, 125d.

The external electrodes 125a, 125c are situated apart from each other, as are the grounding electrodes 125b, 125d. The external electrode 125a and grounding electrode 125d are situated inboard of one edge of the package base 12 in the +Z'-axis direction. The grounding electrode 125b and external electrode 125c are situated inboard of the other edge of the package base 12 in the –Z'-axis direction.

The package lid 11 is fabricated from a glass or piezoelectric material, and has a first peripheral surface M1 on its –Y'-surface. The –Y'-surface defines a lid recess 111 that is surrounded by the first peripheral surface M1. The lid recess 111 extends depthwise in the +Y'-axis direction.

Figure 4:
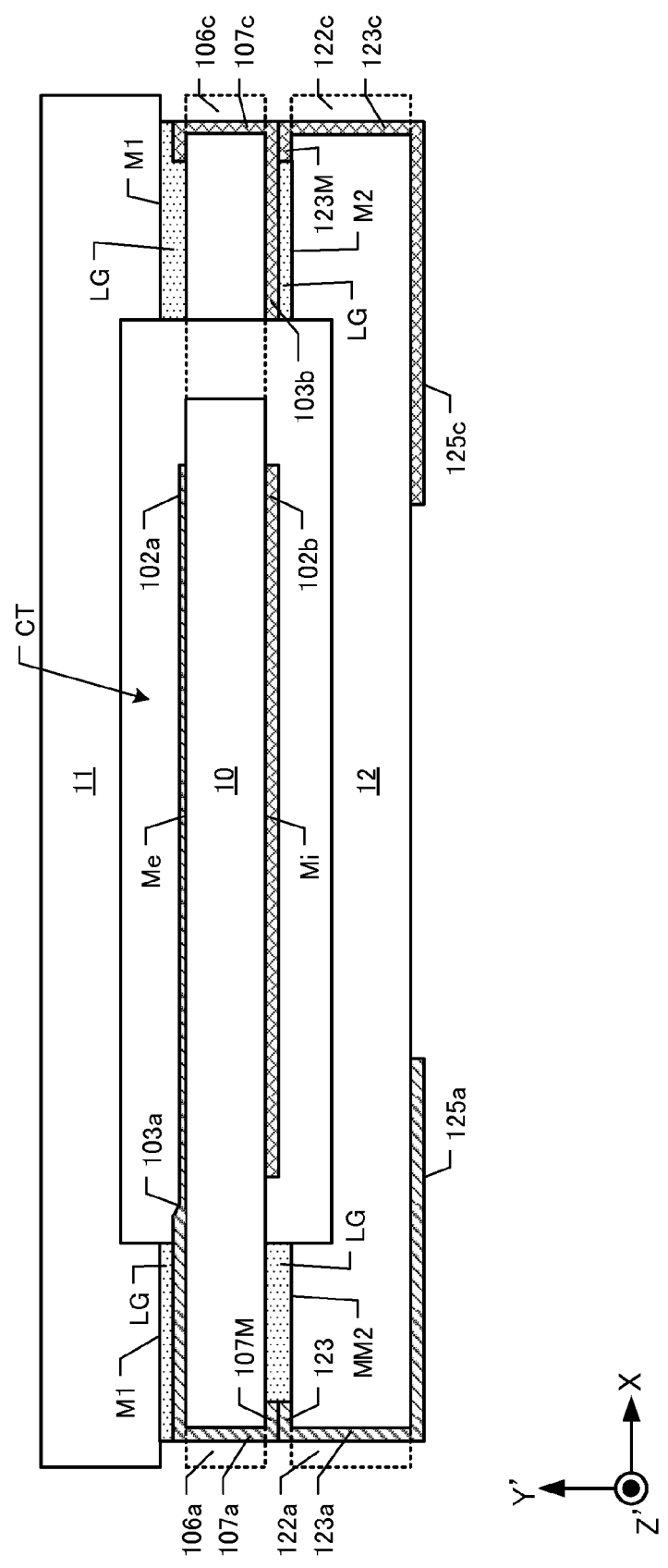
FIG. 4 is an elevational section of the embodiment of FIG. 1, along the line A-A in FIG. 1.

Assembling the quartz-crystal vibrating device 100 is described with reference to FIGS. 1-4. FIG. 4 is a cross-section of FIG. 1 along the line A-A in FIG. 1. The package lid 11 is bonded and sealed to the outer frame of the quartz-crystal vibrating piece 10 using low-melting-point (LMP) glass LG. Specifically, the first peripheral surface M1 of the package lid 11 is bonded to the +Y'-surface of the quartz-crystal vibrating piece 10. LMP glass is also used to bond and seal the package base 12 (specifically, the second peripheral surface M2 thereof) to the outer frame, specifically the –Y'-surface of the quartz-crystal vibrating piece 10. Bonding the package lid 11, outer frame 108, and package base 12 together defines a cavity CT for containing the vibrating portion 101 of the quartz-crystal vibrating piece 10. The cavity CT is filled with an inert gas or evacuated to a desired vacuum.

LMP glass LG is a lead-free vanadium-based glass having an adhesive component that melts at 350° C. to 410° C. Vanadium-based LMP glass can be formulated as a paste mixed with binder and a solvent. Vanadium-based LMP glass bonds to various materials by melting the glass and subsequently solidifying it. LMP glass forms a highly reliable air-tight seal and resists incursion of water and humidity. Also, since the coefficient of thermal expansion of LMP glass can be controlled effectively by controlling its glass structure, this material can adjust to various coefficients of thermal expansion.

The external electrode 125a on the package base 12 is electrically connected to the edge-surface electrode 123a and thus to the connecting pad 123M. Similarly, the external electrode 125c is electrically connected to the edge-surface electrode 123c and thus to the connecting pad 123M. The excitation electrode 102a on the quartz-crystal vibrating piece 10 is electrically connected via the extraction electrode 103a to the edge-surface electrode 107a and thus to the respective connecting pad 107M. Similarly, the excitation electrode 102b is electrically connected via the extraction electrode 103b to the edge-surface electrode 107c and thus to the respective connecting pad 107M.

As shown in FIG. 4, by bonding together the quartz-crystal vibrating piece 10 and package base 12 using LMP glass LG, the respective connecting pads 107M of the edge-surface electrodes 107a, 107c and the respective connecting pads 123M of the base edge-surface electrodes 123a, 123c are electrically connected together. Also electrically connected are the external electrode 125a (on the mounting surface M3 of the package base 12) to the excitation electrode 102a and the external electrode 125c (on the mounting surface M3 of the package base 12) to the excitation electrode 102b. Whenever an alternating voltage (voltage that alternates positive and negative) is applied across the external electrodes 125a, 125c, the vibrating portion 101 exhibits a thickness-shear vibration mode.

Exemplary Method for Manufacturing Quartz-Crystal Vibrating Devices

Figure 5:
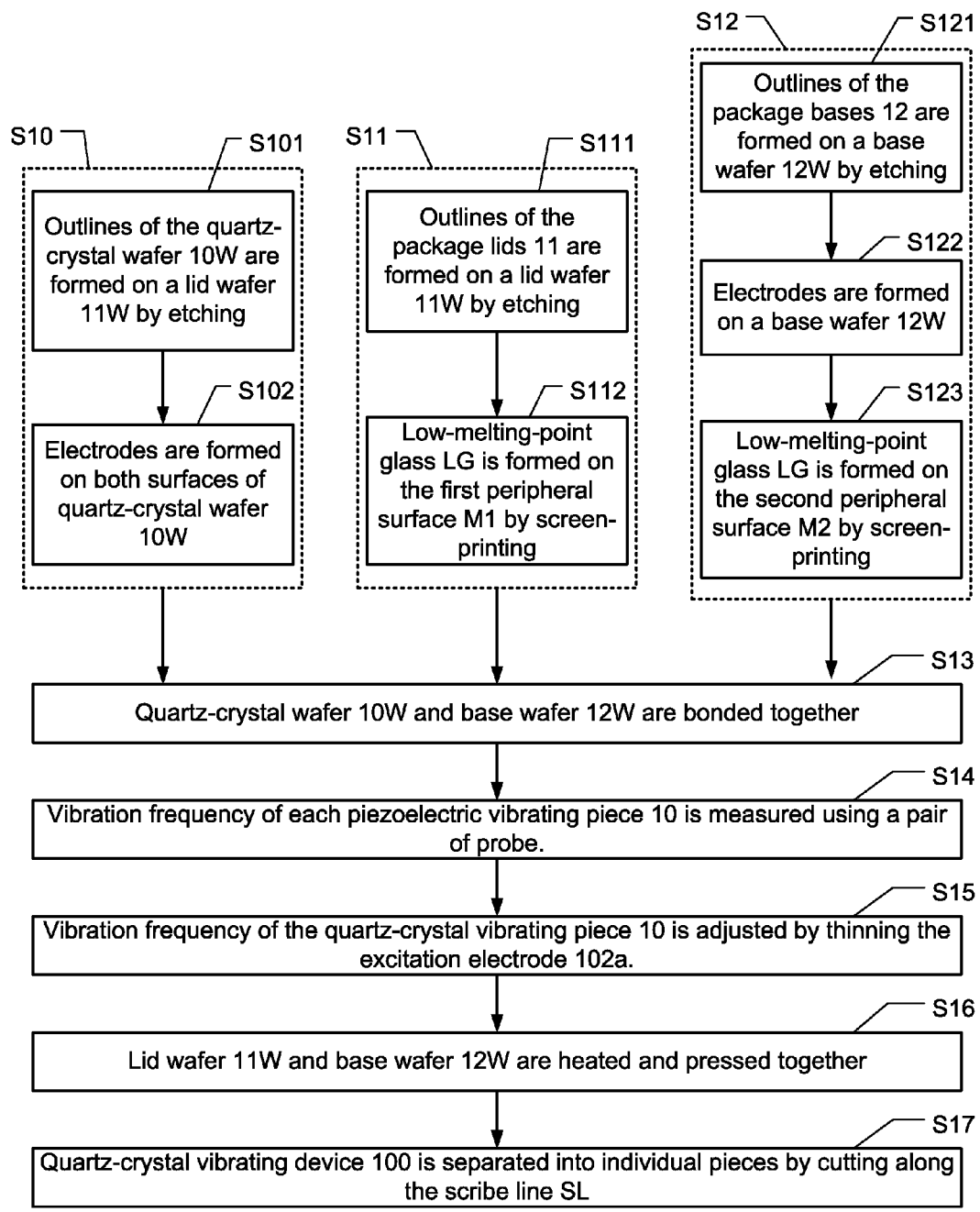
FIG. 5 is a flow-chart of an embodiment of a method for manufacturing the first embodiment of a quartz-crystal vibrating device.
Figure 6:
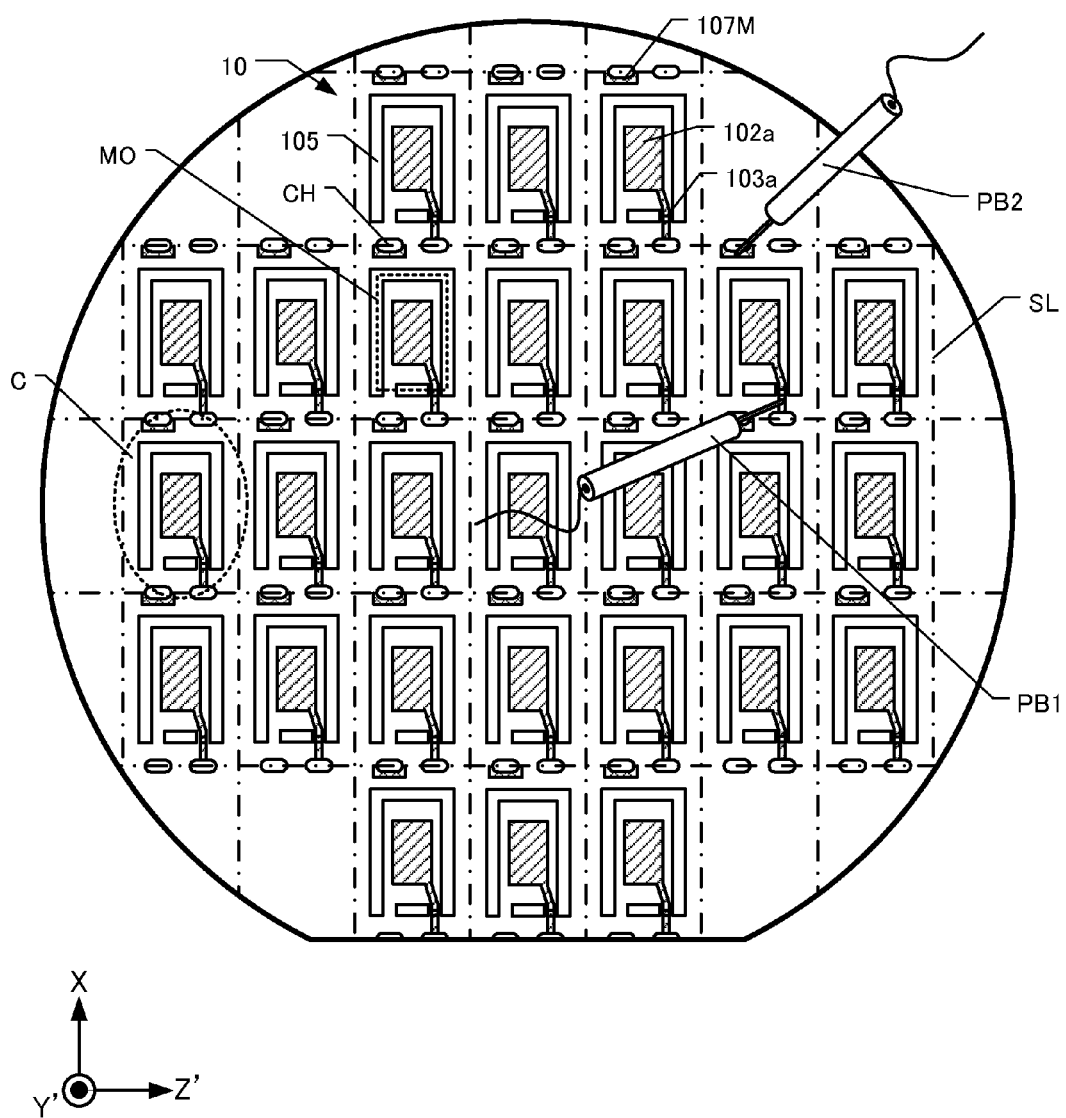
FIG. 6 is a plan view of a quartz-crystal wafer, as viewed from above the +Y'-surface thereof.
Figure 7:
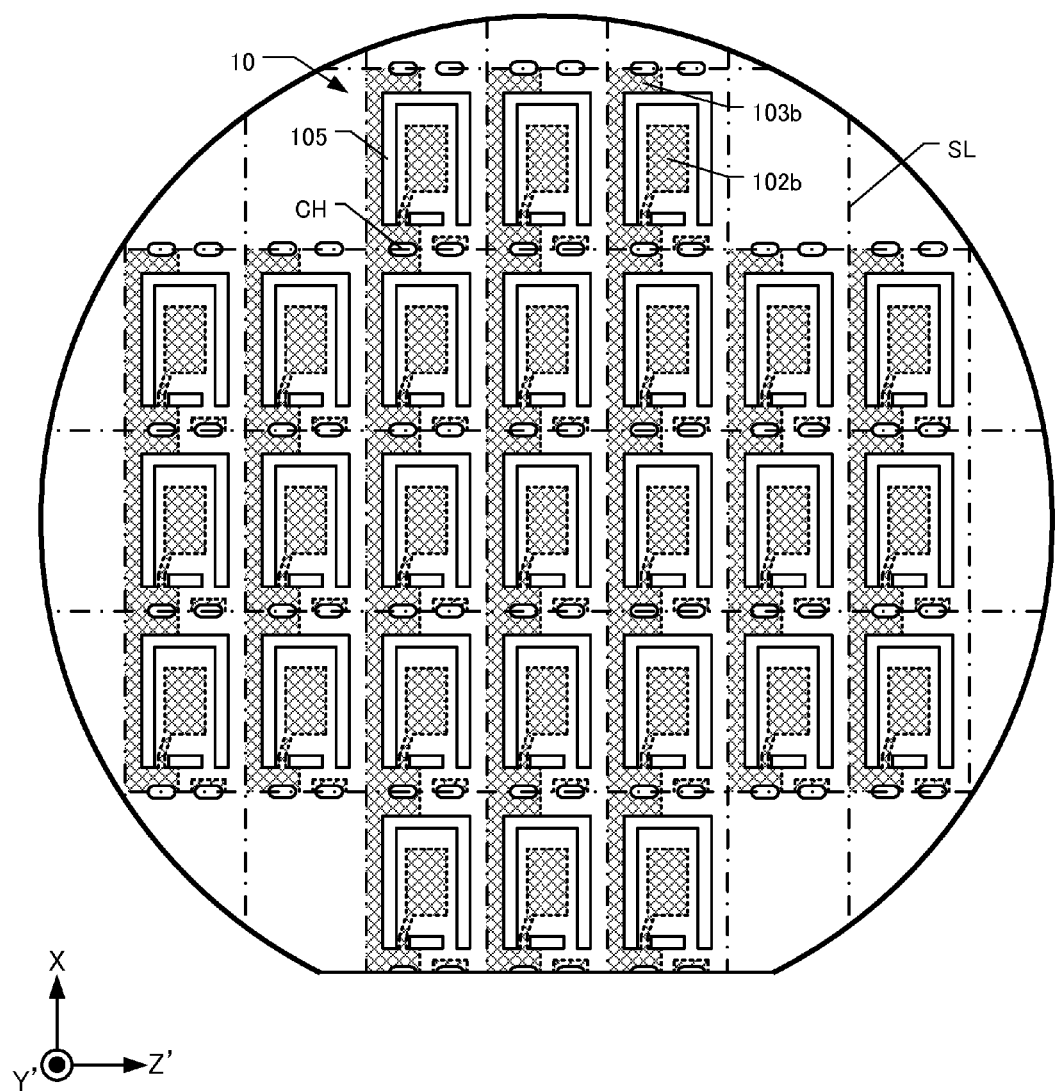
FIG. 7 is a plan view of the quartz-crystal wafer of FIG. 6, but drawn as if it were transparent, as viewed from above the +Y'-surface thereof.
Figure 8:
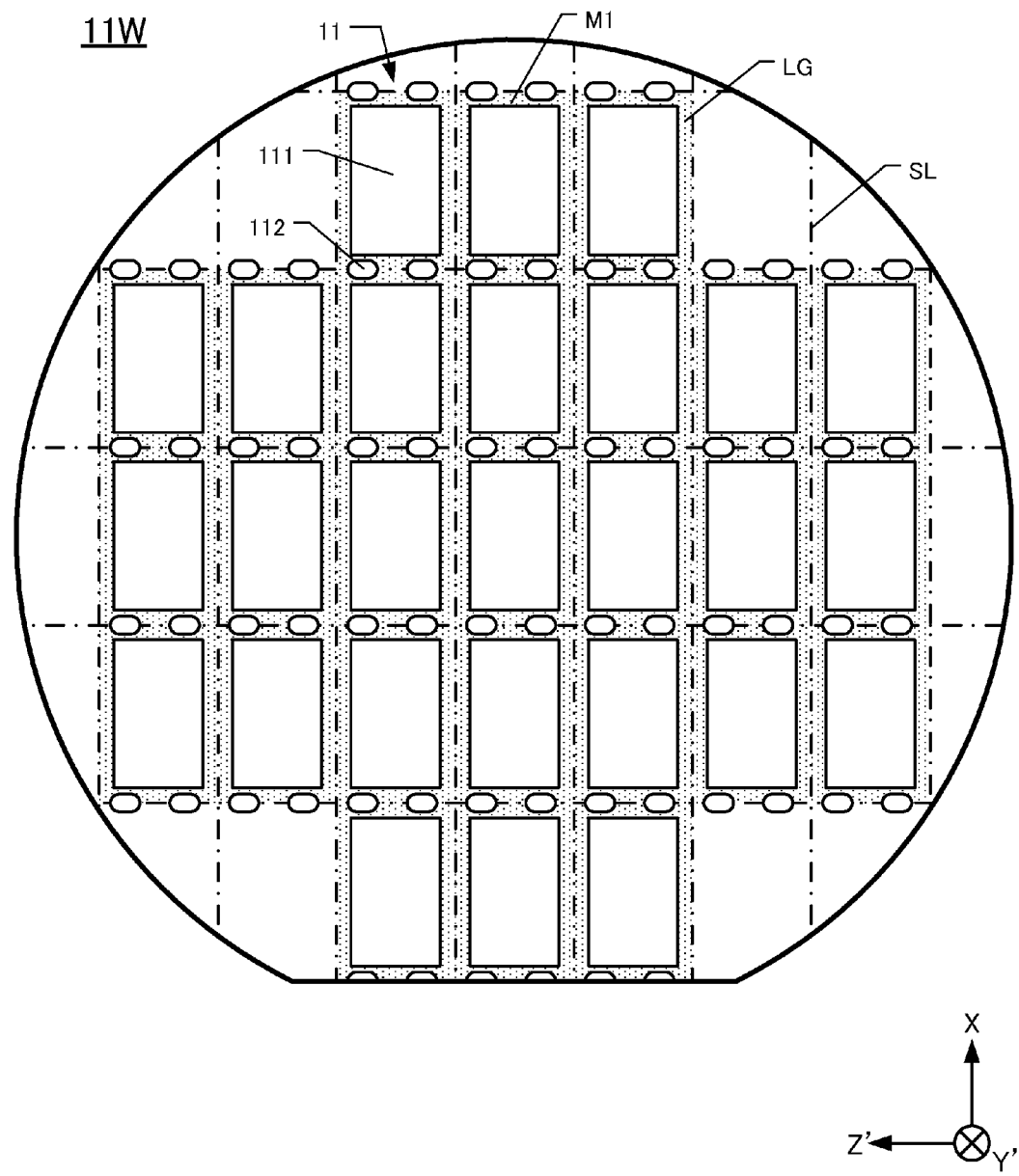
FIG. 8 is a plan view of a lid wafer, as viewed from above the −Y'-surface thereof.
Figure 9:
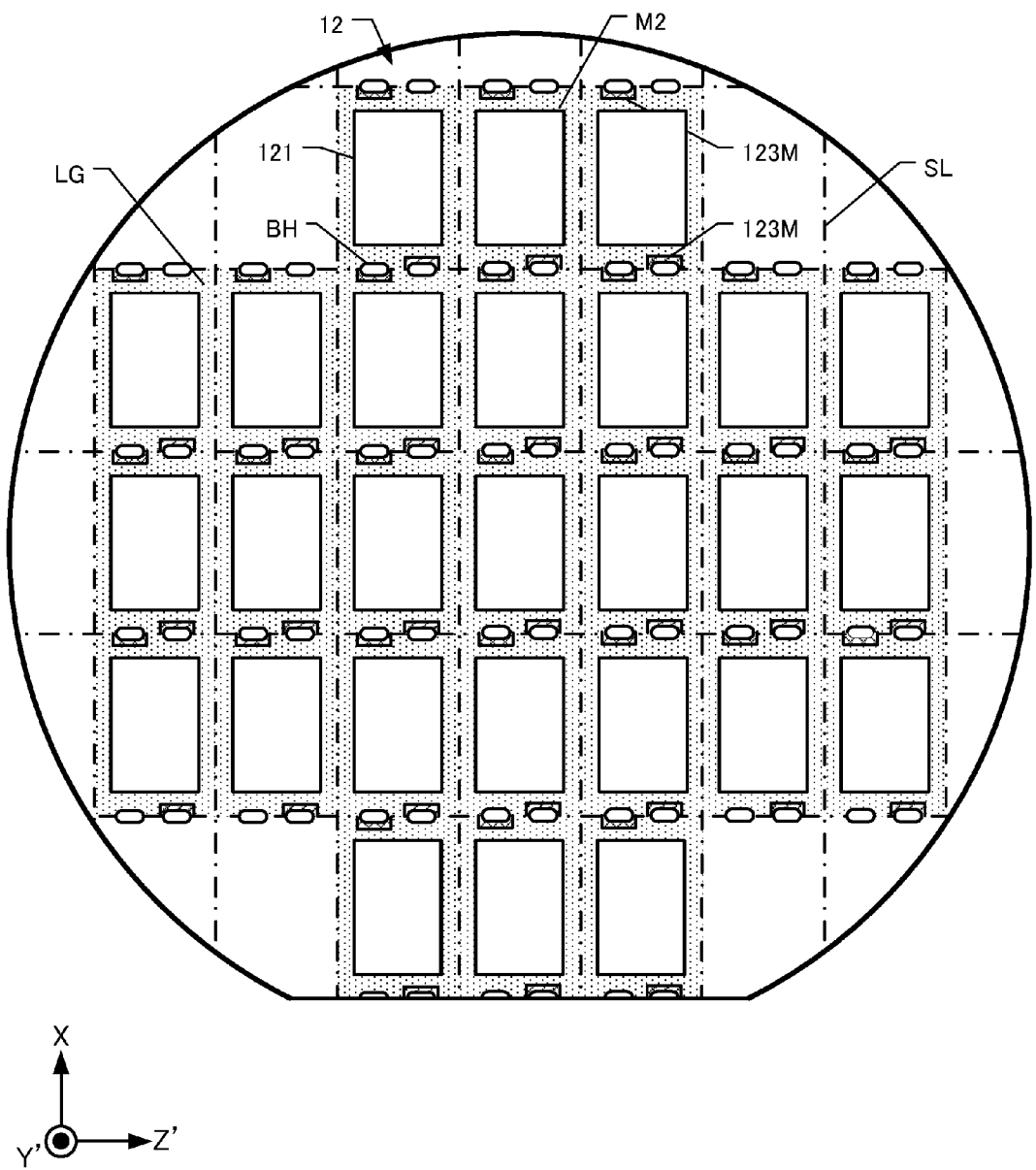
FIG. 9 is a plan view of a base wafer, as viewed from above the +Y'-surface thereof.
Figure 10:
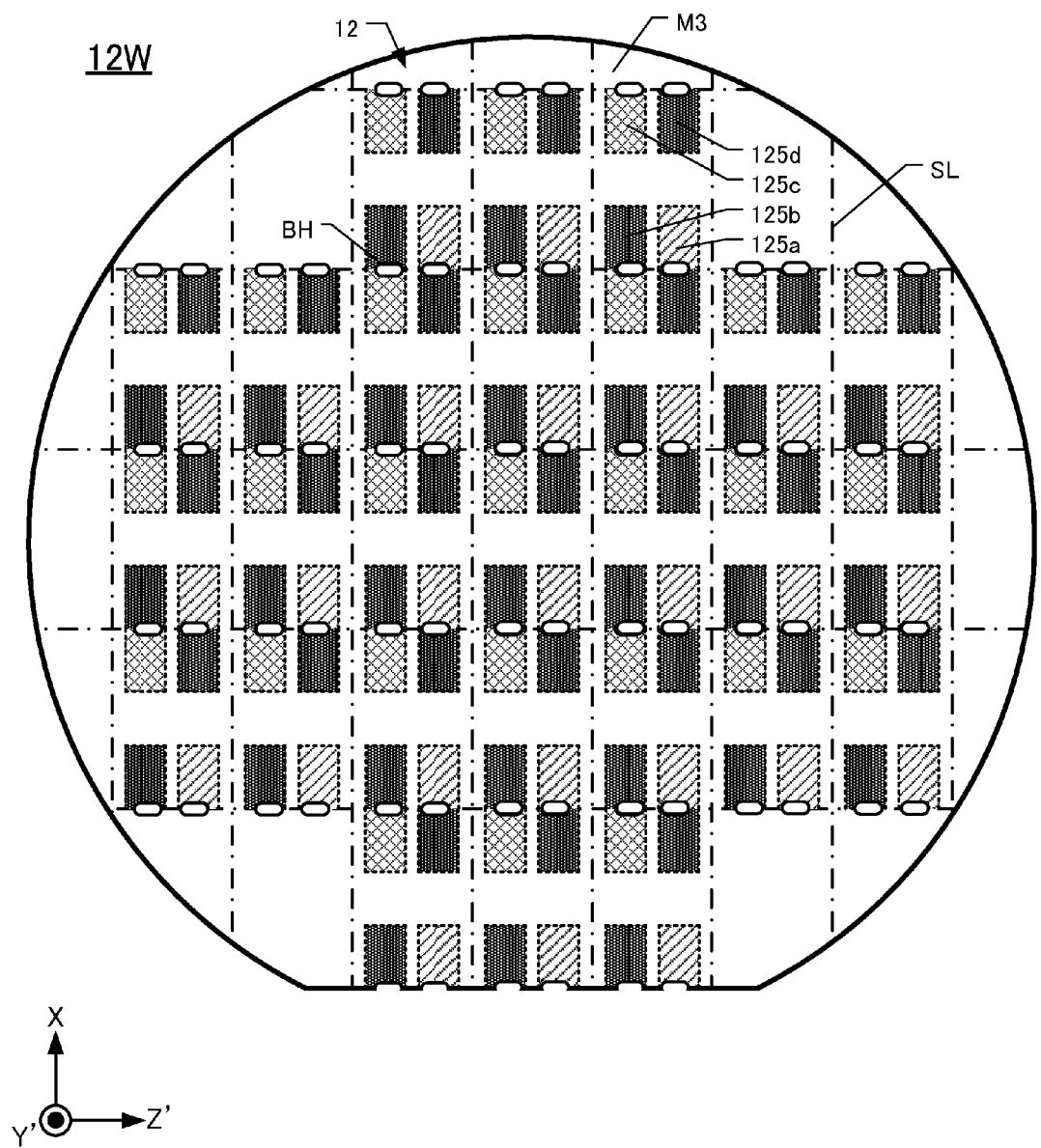
FIG. 10 is a plan view of the base wafer of FIG. 9, but drawn as if it were transparent, as viewed from above the +Y'-surface thereof.

FIG. 5 is a flow-chart of an embodiment of a method for manufacturing quartz-crystal vibrating devices 100. The method shown in FIG. 5 includes a protocol S10 for manufacturing quartz-crystal vibrating pieces 10, a protocol S11 for manufacturing package lids 11, and a protocol S12 for manufacturing package bases 12. These protocols S10, S11, S12 can be performed separately or in parallel. FIG. 6 is a plan view of a quartz-crystal wafer 10W, as viewed from above its +Y'-surface. FIG. 7 is a plan view of a quartz-crystal wafer 10W, drawn as if it were transparent and as viewed from above its +Y'-surface. FIG. 8 is a plan view of a lid wafer 11W as viewed from above its −Y'-surface. FIG. 9 is a plan view of a base wafer 12W as viewed from above its +Y'-surface. FIG. 10 is a plan view of a base wafer 12W, drawn as if it were transparent and as viewed from above its +Y'-axis surface.

In protocol S10, quartz-crystal vibrating pieces 10 are manufactured. The protocol S10 includes steps S101-S102.

In step S101 (see FIGS. 6 and 7), the profile outlines of multiple quartz-crystal vibrating pieces 10 are formed on the planar surface of the quartz-crystal wafer 10W by controlled etching. Several hundreds to several thousands of vibrating pieces 10 are formed on the wafer 10W as wafer size permits. Through-slots 105 are etched through the thickness dimension of the wafer to form respective quartz-crystal vibrating pieces 10, each having a respective vibrating portion 101, respective joining portions 104a, 104b, and a respective outer frame 108. The through-slots 105 extend completely through the thickness dimension of the quartz-crystal wafer 10W. Etching also forms two round-ended through-holes CH on each X-edge of each quartz-crystal vibrating piece 10. The round-ended through-holes CH extend completely through the thickness dimension of the quartz-crystal wafer 10W. During a later dicing step, the through-holes CH are cut through to farm respective castellations 106a-106d (see FIG. 1) on each vibrating piece 10.

In step S102 a layer of chromium is formed on each main surface of the quartz-crystal wafer 10W, followed by formation of an overlying layer of gold. These layers are also formed on the edge surfaces of the quartz-crystal wafer 10W. The layers are formed by sputtering or vacuum-deposition. Then, a layer of photoresist is applied uniformly on the surface of each gold layer. Using an exposure tool (not shown), the profile outlines of the excitation electrodes and extraction electrodes are lithographically exposed onto the resist. The resist is developed, and soluble regions of the resist are removed to render corresponding regions of the metal layers vulnerable to wet-etching. Upon completion of etching, the result is as shown in FIGS. 6 and 7, showing multiple quartz-crystal vibrating pieces including respective excitation electrodes 102a, 102b. A respective excitation electrode is formed in the center of each vibrating portion 101 on both principal surfaces of the quartz-crystal wafer 10W. Also formed are respective extraction electrodes 103a, 103b, connecting pads 107M, joining portions 104a, 104b, and outer frames 108. Simultaneously, respective edge-surface electrodes 107a, 107b are formed in the through-holes CH.

The gold (Au) layer for forming the excitation electrode 102a and extraction electrode 103a on the first surface Me of the quartz-crystal wafer 10W is formed relatively thick, so that the vibration frequency of each quartz-crystal vibrating piece 10 is initially lower than desired.

The excitation electrodes 102a, 102b on each quartz-crystal vibrating device 10 are electrically connected to respective edge-surface electrodes 107a, 107c in the through-holes CH. The edge-surface electrodes 107a, 107c are situated diagonally from each other. Thus, the excitation electrodes 102a and excitation electrodes 102b are not connected together electrically.

In protocol S11, package lids 11 are manufactured. Protocol S11 includes steps S111 and S112. In step S111, as shown in FIG. 8, the profile outlines of multiple package lids 11 are formed on a lid wafer 11W, which is a circular, uniformly planar plate of quartz-crystal material. Several hundreds to several thousands of lid recesses 111 are formed on the lid wafer 11W as wafer size permits. The lid recesses 111 are formed by etching or mechanical processing, leaving a respective first peripheral surface M1 around each lid recess 111. In step S112 LMP glass LG is applied (e.g., by screen-printing) on the first peripheral surfaces M1 of the lid wafer 11W. Preliminary curing forms respective films of LMP glass on the first peripheral surfaces M1. The film of LMP glass LG is not applied to regions 112 corresponding to the through-holes CH (see FIGS. 6 and 7) on the quartz-crystal wafer 11W.

In protocol S12, package bases 12 are manufactured. Protocol S12 includes steps S121-S123. In step S121, as shown in FIGS. 9 and 10, the profile outlines of multiple package bases 12 are formed on a base wafer 12W, which is a circular, uniformly planar plate of quartz-crystal material. Several hundreds to several thousands of package bases 121 are formed on the base wafer 12W as wafer size permits (usually, the number and arrangement of package bases 12 on the base wafer 12W are the same as the number and arrangement of lids 11 on the lid wafer 11W, which are the same as the number and arrangement of vibrating pieces 10 on the quartz-crystal wafer 10W). A central base recess 121 is formed in each package base 12 by etching or mechanical processing. Also formed are round-ended through-holes BH arranged along cut lines destined to be respective +X- and −X-edges of the package bases 12. During a later dicing step, the through-holes BH become respective castellations 122a-122d (see FIG. 1).

In step S122, a foundation layer of chromium (Cr) is formed on both main surfaces of the base wafer by sputtering or etching. Applied to the chromium layers are respective overlying layers of gold (Au) by sputtering or etching. Then, as shown in FIGS. 9 and 10, external electrodes 125a, 125c and grounding electrodes 125b, 125d are formed on the mounting surfaces M3 by etching. Simultaneously, edge-surface electrodes 123a-123d are formed in the base through-holes BH, and connecting pads 123M are formed on the second peripheral surfaces M2.

As shown in FIG. 10, external electrodes 125a and grounding electrodes 125d of adjacent package bases 12 in the X-axis direction are formed as single units (each unit consisting of one external electrode 125a and one grounding electrode 125d). Similarly, external electrodes 125c and grounding electrodes 125b of adjacent package bases 12 in the X-axis direction are formed as single units. Meanwhile, external electrodes 125a, 125c and mounting terminals 125b, 125b of adjacent package bases in the Z'-axis direction are separated by predetermined spaces. For example, the external electrode 125a is electrically connected only to the grounding electrode 125d in the immediately adjacent (in the X-axis direction) package base, and the external electrode 125c is electrically connected only to the grounding electrode 125b in the immediately adjacent (in the X-axis direction) package base. Consequently, the external electrodes 125a and 125c are not electrically connected to each other.

In step S123 LMP glass LG is applied to the second peripheral surface M2 by screen-printing, for example. Preliminary curing converts the LMP glass to corresponding films of LMP glass LG. The films of LMP glass preferably do not extend to locations at which the connecting pads 123M are formed on the second peripheral surface M2.

In step S13 the quartz-crystal wafer 10W manufactured in protocol S10 and the base wafer 12W manufactured in protocol S12 are bonded together by melting the LMP glass LG. The quartz-crystal wafer 10W and the base wafer 12W are bonded together so as to obtain contact of each connecting pad 107M of the quartz-crystal wafer 10W with a corresponding connecting pad 123M of the base wafer 12W (see FIG. 4).

In step S14 respective probes PB1, PB2 (refer to FIG. 6) for measuring vibration frequency are contacted to respective electrodes of each quartz-crystal vibrating piece 10 to measure the vibration frequency of each piece. Specifically, the probe PB1 is connected to the extraction electrode 103a (connected to the excitation electrode 102a), and the probe PB2 is connected to the connecting pad 107M (connected to the excitation electrode 102b which is connected to the extraction electrode 103b). Thus, the vibration frequency of each quartz-crystal vibrating piece 10 is measured.

As described in step S102, the extraction electrodes 102a, 102b of each vibrating piece on the quartz-crystal wafer 10W are not electrically connected to each other, and the extraction electrodes 103a, 103b are also not electrically connected to each other. Also, as described in step S122, the external electrodes 125a, 125c of each package base on the base wafer 12W are not electrically connected to each other. Thus, the vibration frequency of each quartz-crystal vibrating piece can be measured without the measurement being affected by adjacent quartz-crystal vibrating pieces.

In step S15, the vibration frequency of the quartz-crystal vibrating piece 10 can be increased by reducing the thickness of the excitation electrode 102a and extraction electrode 103a of the vibrating portion 101. This thinning desirably is performed by ablation using an ion beam. More specifically, an ion beam is incident, through an opening MO in a mask, to the excitation electrode 102a and extraction electrode 103a. The beam passing through the opening MO removes, by "ion-milling," material from the excitation electrode 102a and extraction electrode 103a.

The mask opening MO is shown in FIG. 6, in which the opening is rectangular in this embodiment. The size and shape of the opening MO in the +X-axis direction and ±Z'-axis directions are similar to the outline profile of the vibrating portion 101. Also, the −X-axis direction of the opening MO extends to corresponding regions of the joining portions 104a, 104b. By ion-milling, as shown in FIGS. 2C and 4, the excitation electrode 102a and extraction electrode 103a within the opening MO (i.e., within the vibrating portion 101) are reduced in thickness. Initially, the excitation electrode 102a and extraction electrode 103a are formed at uniform thickness, which prevents unnecessary vibration and degradation of vibration characteristics. Although the opening MO in the −X-axis direction corresponds to the joining portions 104a and 104b, this part of the opening MO can correspond to the vibrating portion 101.

The opening region MO of the mask is now described, with reference to FIG. 11A. FIG. 11A is an enlarged view of the region encircled by a dotted line C in FIG. 6. FIG. 11A shows an exemplary shape of the opening MO of the mask. In FIG. 11A the shortest length $L_{min}$ of the opening MO in the X-axis direction is the distance between the edge portion of the excitation electrode 102a in the +X-axis direction to the vibrating portion 101 in the −X-axis direction. The shortest width $W_{min}$ of the opening MO in the Z'-axis direction is the width between the edge portion in the −Z'-axis direction of the excitation electrode 102a to the +Z'-axis edge of the extraction electrode 103a. As long as the length $L_{min}$ and width $W_{min}$ are maintained, the respective thicknesses of the excitation electrode 102a and extraction electrode 103a on the quartz-crystal vibrating piece 101 can be uniform, as desired.

The shape of the opening MO in the mask can have various shapes and dimensions. FIG. 11B is an enlarged view of the region encircled by a dotted line C in FIG. 6. FIG. 11B depicts an exemplary shape of the opening MO of the mask. In FIG. 11B the positions of the edges in the +X-axis direction and ±Z'-axis directions on the rectangular opening MO are substantially identical to peripheral portions of the vibration portion 101. Also, the −X-edge of the opening MO extends to the outer frame 108. Thus, the excitation electrode 102a and extraction electrode 103a situated within the opening MO (region inside the vibrating portion 101 and joining portion 104a) can be made thinner by ion-milling. Although not shown, the −X-axis direction edge of the opening MO can extend to the castellation on the outer frame 108. The excitation electrode 102a and extraction electrode 103a of the vibrating portion 101 are formed at uniform thickness, which prevents unnecessary vibrations and degradations of vibration characteristics.

The shape of the opening MO in the mask need not be rectangular; other shapes are possible. For example, FIG. 11C is an enlarged view of the region encircled by a dotted line C in FIG. 6, and depicts an exemplar shape of the opening MO. The locations of portions of the opening MO in the +X-axis direction and ±Z'-axis directions are almost the same as the corresponding excitation electrode 102a. In this embodiment the opening MO is slightly larger than the excitation electrode 102a. Also, a part of the opening MO in the −X-axis direction corresponds to the respective shapes of the extraction electrodes 103a, 103b situated on each principal surfaces of the vibrating portion 101. Thus, the opening MO in FIG. 11C has a trapezoidal portion in which the opening becomes wider in the Z'-axis directions along the −X-axis direction. Also, the edge of the opening MO in the −X-axis direction is formed extending to the joining portions 104a, 104b. Thus, the excitation electrode 102a and extraction electrode 103a situated within the opening MO (region inside the vibrating portion 101 and joining portion 104a) can be thinned by ion-milling. The excitation electrode 102a and extraction electrode 103a on the vibrating portion 101 are initially formed at a uniform thickness to prevent unnecessary vibrations and degradation of vibration characteristics.

Returning to FIG. 5, in step S16, the LMP glass is heated and the lid wafer and base wafer 12W are compressed toward each other to bond the lid wafer and base wafer to the quartz-crystal wafer. Thus, the lid wafer 11A and base wafer 12W are bonded together by using low-melting-point glass LG, while the vibrating portion 101 of the quartz-crystal vibrating piece 10 is enclosed within the cavity CT (see FIG. 4).

In step S17 the wafer sandwich is cut up ("diced") to separate individual quartz-crystal vibrating devices from the sandwich and from each other. This cutting is performed by cutting along the scribe lines SL, denoted by dot-dash lines in FIGS. 6-10. Dicing is usually performed using a dicing unit such as a laser beam or a dicing saw. Thus, several hundreds to several thousands of quartz-crystal vibrating devices 100 are produced.

INDUSTRIAL APPLICABILITY

Representative embodiments have been described in detail above. As evident to those skilled in the art, the present invention may be changed or modified in various ways within the technical scope of the invention. For example, although LMP glass was used for bonding together the base wafer, quartz-crystal wafer, and lid wafer, this bonding material can be replaced with polyimide resin. Polyimide resin can be applied by screen-printing or exposed after applying photo-sensitive polyimide resin on the entire surface.

In this specification, although the various embodiments have been described in the context of quartz-crystal vibrating pieces, it will be understood that the embodiments can be applied with equal facility to piezoelectric materials such as lithium tantalite and lithium niobate. Furthermore, the present disclosure can be applied to piezoelectric oscillators that also include an IC configured as an oscillating circuit mounted inside the package on the package base.

Furthermore, although the various embodiments have been described in the context of the AT-cut quartz-crystal vibrating pieces, it can be applied with equal facility to tuning-fork type quartz-crystal vibrating pieces.

What is claimed is:

1. A piezoelectric vibrating piece, comprising:
    a vibrating portion having a center region including an excitation electrode, the excitation electrode being no thicker than a first thickness;
    an outer frame surrounding the vibrating portion, with a gap between the vibrating portion and the outer frame;
    a joining portion extending across the gap and coupling the vibrating portion to the outer frame; and
    an extraction electrode electrically connected to the excitation electrode and extending from the vibrating portion, over the joining portion, to the outer frame;
    the extraction electrode having the first thickness on the vibrating portion and a second thickness on at least part of the joining portion or on at least part of the outer frame, the second thickness being greater than the first thickness.

2. The piezoelectric vibrating piece of claim 1, wherein the extraction electrode on the joining portion includes at least a portion thereof having the first thickness.

3. The piezoelectric vibrating piece of claim 2, wherein:
    a first excitation electrode having the first thickness is situated on a first main surface of the vibrating portion; and
    a second excitation electrode having the second thickness is situated on a second main surface, opposite the first main surface, of the vibrating portion, the second excitation electrode being coextensive with the first excitation electrode.

4. The piezoelectric vibrating piece of claim 2, configured as a mesa-type, a plano-mesa type, an inverted-mesa-type, or inverted-plano-mesa type.

5. A piezoelectric device, comprising:
    a piezoelectric vibrating piece as recited in claim 2;
    a first plate bonded to a first main surface of the outer frame; and
    a second plate bonded to a second main surface of the outer frame.

6. The piezoelectric vibrating piece of claim 1, wherein the extraction electrode on the outer frame includes at least a portion thereof having the first thickness.

7. The piezoelectric vibrating piece of claim 6, wherein:
    a first excitation electrode having the first thickness is situated on a first main surface of the vibrating portion; and
    a second excitation electrode having the second thickness is situated on a second main surface, opposite the first main surface, of the vibrating portion, the second excitation electrode being coextensive with the first excitation electrode.

8. The piezoelectric vibrating piece of claim 6, configured as a mesa-type, a piano-mesa type, an inverted-mesa-type, or inverted-piano-mesa type.

9. A piezoelectric device, comprising:
    a piezoelectric vibrating piece as recited in claim 6;
    a first plate bonded to a first main surface of the outer frame; and
    a second plate bonded to a second main surface of the outer frame.

10. The piezoelectric vibrating piece of claim 1, wherein:
    a first excitation electrode having the first thickness is situated on a first main surface of the vibrating portion; and
    a second excitation electrode having the second thickness is situated on a second main surface, opposite the first main surface, of the vibrating portion, the second excitation electrode being coextensive with the first excitation electrode.

11. The piezoelectric vibrating piece of claim 10, configured as a mesa-type, a piano-mesa type, an inverted-mesa-type, or inverted-piano-mesa type.

12. A piezoelectric device, further comprising:
    a piezoelectric vibrating piece as recited in claim 10;
    a first plate bonded to a first main surface of the outer frame; and
    a second plate bonded to a second main surface of the outer frame.

13. The piezoelectric vibrating piece of claim 1, configured as a mesa-type, a plano-mesa type, an inverted-mesa-type, or inverted-piano-mesa type.

14. A piezoelectric device, comprising:
    a piezoelectric vibrating piece as recited in claim 1;
    a first plate bonded to a first main surface of the outer frame; and
    a second plate bonded to the other main surface of the outer frame.

* * * * *